United States Patent
Wang et al.

(10) Patent No.: US 7,304,385 B2
(45) Date of Patent: *Dec. 4, 2007

(54) SEMICONDUCTOR CHIP CAPABLE OF IMPLEMENTING WIRE BONDING OVER ACTIVE CIRCUITS

(75) Inventors: Kun-Chih Wang, Hsin-Chu (TW); Bing-Chang Wu, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/422,330

(22) Filed: Jun. 6, 2006

(65) Prior Publication Data

US 2006/0226547 A1    Oct. 12, 2006

Related U.S. Application Data

(60) Division of application No. 10/907,959, filed on Apr. 22, 2005, now Pat. No. 7,208,837, which is a continuation-in-part of application No. 10/708,109, filed on Feb. 10, 2004, now Pat. No. 6,900,541.

(51) Int. Cl.
*H01L 23/48* (2006.01)
*H01L 23/52* (2006.01)
*H01L 29/40* (2006.01)

(52) U.S. Cl. ............... 257/758; 257/759; 257/E23.046; 257/E23.052

(58) Field of Classification Search ........ 257/758–760, 257/762, 765, 784

See application file for complete search history.

(56) References Cited

U.S. PATENT DOCUMENTS

| | | | |
|---|---|---|---|
| 6,022,791 A | 2/2000 | Cook et al. | |
| 6,522,021 B2 | 2/2003 | Sakihama et al. | |
| 6,717,270 B1 | 4/2004 | Downey et al. | |
| 6,727,590 B2 | 4/2004 | Izumitani et al. | |
| 6,731,007 B1 | 5/2004 | Saito et al. | |
| 6,900,541 B1* | 5/2005 | Wang et al. | 257/758 |
| 6,927,160 B1* | 8/2005 | Kitch | 438/631 |
| 2003/0020180 A1 | 1/2003 | Ahn et al. | |
| 2003/0162354 A1 | 8/2003 | Hashimoto et al. | |
| 2003/0230805 A1 | 12/2003 | Noma et al. | |

* cited by examiner

*Primary Examiner*—Theresa T Doan
(74) *Attorney, Agent, or Firm*—Winston Hsu

(57) ABSTRACT

A reinforced bonding pad structure includes a bondable metal layer defined on a stress-buffering dielectric layer, and an intermediate metal layer damascened in a first inter-metal dielectric (IMD) layer disposed under the stress-buffering dielectric layer. The intermediate metal layer is situated directly under the bondable metal layer and is electrically connected to the bondable metal layer with a plurality of via plugs integrated with the bondable metal layer. A metal frame is damascened in a second IMD layer under the first IMD layer. The metal frame is situated directly under the intermediate metal layer for counteracting mechanical stress exerted on the bondable metal layer during bonding, when the thickness of said stress-buffering dielectric layer is greater than 2000 angstroms, the damascened metal frame may be omitted. An active circuit portion including active circuit components of the integrated circuit is situated directly under the metal frame.

3 Claims, 3 Drawing Sheets

SEMICONDUCTOR CHIP CAPABLE OF IMPLEMENTING WIRE BONDING OVER ACTIVE CIRCUITS

CROSS REFERENCE TO RELATED APPLICATIONS

This is a divisional application of U.S. patent application Ser. No. 10/907,959 filed Apr. 22, 2005, now U.S. Pat. No. 7,208,873 which itself is a continuation-in-part of U.S. application Ser. No. 10/708,109 filed Feb. 10, 2004 now U.S. Pat. No. 6,900,541.

BACKGROUND OF THE INVENTION

1. Field of the Invention

The present invention relates to the field of semiconductor integrated circuits (ICs), and more particularly to a semiconductor chip capable of employing wire bonding over active circuits (also referred to as "BOAC").

2. Description of the Prior Art

Technology improvements continue to drive the evolution of integrated circuits toward increased complexity and smaller feature sizes. At the same time, chips are being designed for wider word systems that require larger numbers of input/output (I/O) connections. For some devices, this results in chips that are pad area limited. That is, the peripheral area required by the bonding pads defines the chip size rather than the smaller area required by the active circuits. These lead to device designs with tighter bond pad sizes and pitches and consequently imposes constraints on wire bonding. Choices to counteract this trend may be more costly area array interconnection solutions such as bumped chips for flip chip assembly. Wire bonding over the active array may provide a preferable alternative.

Bonding pads are typically arranged in rows along four chip sides. As known to those skilled in the art, the prior art design rules exclude the area covered by the bonding pads from use for laying out actual circuit patterns because of the high risk of damaging the circuit structures due to the unavoidable forces needed in the bonding process. Therefore, there is a strong need to provide an integrated circuit having a reinforced bonding pad structure to counteract mechanical stress exerted thereon, whereby protecting the active circuit components situated directly under the bonding pads from potential damages during bonding.

SUMMARY OF THE INVENTION

It is therefore the primary object of the present invention to provide an improved integrated circuit having a reinforced bonding pad structure capable of implementing BOAC, thereby saving valuable silicon area.

According to the claimed invention, an integrated circuit including a reinforced bonding pad structure is disclosed. The reinforced bonding pad structure includes a bondable metal layer defined on a stress-buffering dielectric layer, and an intermediate metal layer damascened in a first inter-metal dielectric (IMD) layer disposed under the stress-buffering dielectric layer. The intermediate metal layer is situated directly under the bondable metal layer and is electrically connected to the bondable metal layer with a plurality of via plugs that are integrated with the overlying bondable metal layer. At least one metal frame is damascened in a second IMD layer under the first IMD layer. The metal frame is situated directly under the intermediate metal layer for counteracting mechanical stress transmitted from the bondable metal layer during bonding. An active circuit portion including active circuit components of the integrated circuit is situated directly under the metal frame of the reinforced bonding pad structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
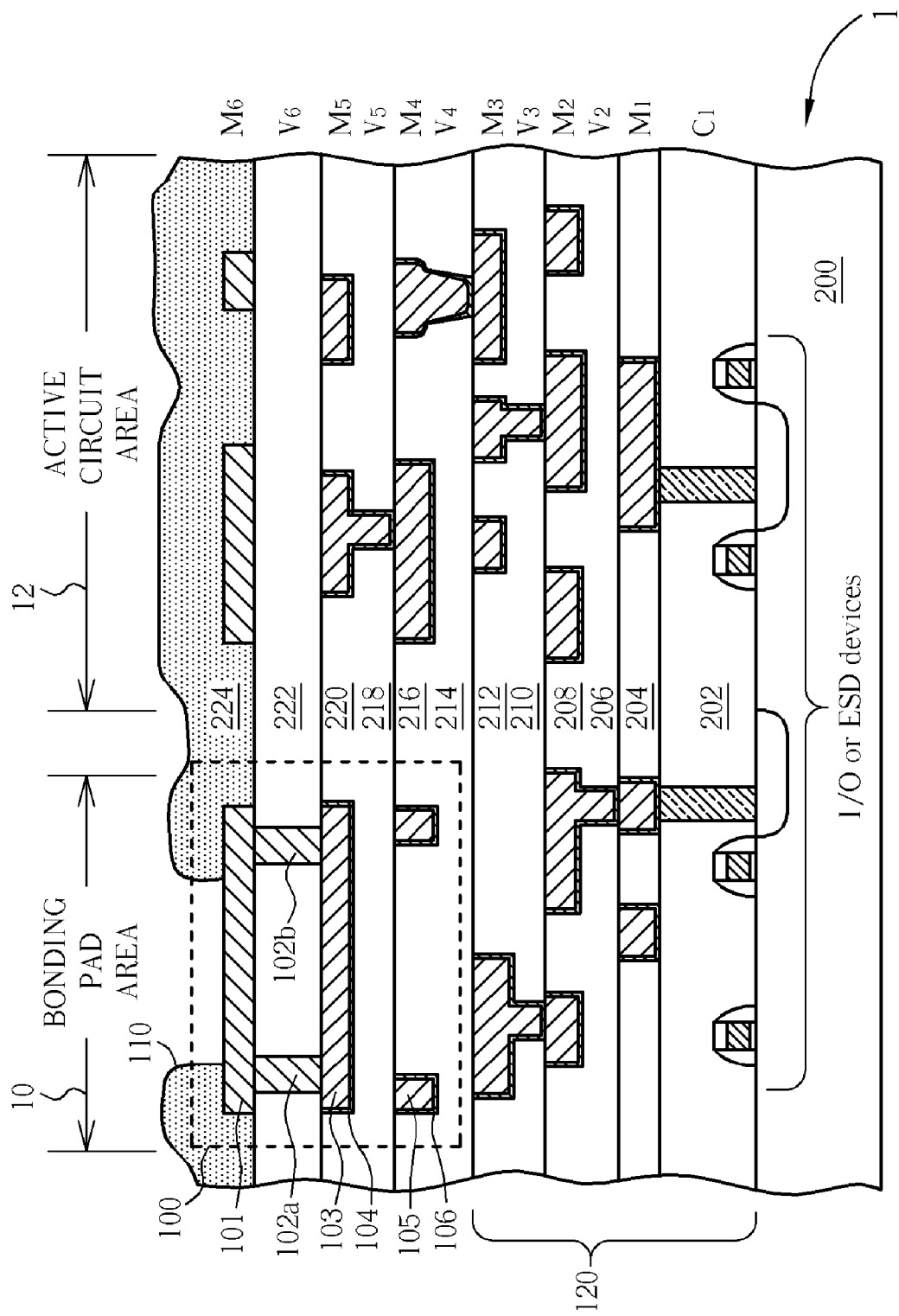
FIG. 1 is a schematic cross-sectional diagram illustrating pivotal portions of an exemplary integrated circuit capable of implementing BOAC in accordance with the first preferred embodiment of the present invention.

Please refer to FIG. 1. FIG. 1 is a schematic cross-sectional diagram illustrating pivotal portions of an exemplary integrated circuit capable of implementing BOAC in accordance with the first preferred embodiment of the present invention. As shown in FIG. 1, the integrated circuit 1 according to the present invention comprises a bonding pad area 10 and an active circuit area 12. A bonding pad reinforcement structure 100 is disposed within the bonding pad area 10. Portions of the active circuit components 120 of the integrated circuit 1 are situated directly under the bonding pad reinforcement structure 100. By way of example, the active circuit components may include input/output (I/O) devices/circuits, or Electrostatic Discharge (ESD) devices/circuits, each of which may further consist of a plurality of semiconductor devices, which are fabricated on a main surface of a substrate 200, for example, such as metal-oxide-semiconductor field-effect transistors (MOSFETs), ion diffusions, etc., and several layers of metal interconnections. For the sake of simplicity, an integrated circuit having six layers of metal interconnections is taken as an example and is illustrated in FIG. 1. However, person skilled in the art will appreciate that the number of metal interconnections should not be limited thereto. For example, the present invention can also be applied in integrated circuits with seven, eight or even higher layers of metal interconnections.

In FIG. 1, the exemplary six layers of metal interconnections are denoted by M1, M2, M3, M4, M5, and M6, respectively. The metal interconnection M6 is the top metal of the integrated circuit 1. In the active circuit area 12, the exemplary six layers of metal interconnections are patterned to form designed active circuit layouts in respective levels, and a plurality of semiconductor devices such as MOSFETs, ion diffusions, capacitors, etc., are provided on the main surface of the substrate 200. According to the preferred embodiment of the present invention, the lower five layers of metal interconnections: M1, M2, M3, M4, and M5 are fabricated by standard copper damascene or dual damascene techniques. The top metal interconnection M6 is fabricated using conventional aluminum (Al) system. The metal interconnection M1 is defined in the low-k dielectric layer 204 above the dielectric layer 202, and is electrically connected to the underlying semiconductor devices on the substrate 200 through contacts C1 fabricated in the dielectric layer 202. The dielectric layer 202 may be silicon dioxide, fluoride silicate glass (FSG), or the like. The active circuit 120 directly under the bonding pad reinforcement structure 100 includes metal interconnections: M1, M2, and M3. In the bonding pad area 10, the rest of the metal interconnections: M4, M5, and M6 are defined to form parts of the bonding pad reinforcement structure 100.

Still referring to FIG. 1, the metal interconnection M2 is defined in the dielectric layer 208 using damascene method known in the art to form designed circuit layout within both the bonding pad area 10 and the active circuit area 12. Damascene via devices (V2) for connecting M1 with M2 are fabricated in dielectric layer 206. The dielectric layers 206 and 208 may be made of the same low-k (or ultra low-k; k<2.5) dielectric materials. In some cases, the dielectric layers 206 and 208 are made of different dielectric materials. Depending on the damascene methods, a stop layer (not shown) may be interposed between dielectric layers 206 and 208. Likewise, the metal interconnection M3 is defined in the low-k dielectric layer 212 using damascene method known in the art to form designed circuit layout within both the bonding pad area 10 and the active circuit area 12. Damascene via devices (V3) for connecting M2 with M3 are fabricated in dielectric layer 210. The dielectric layers 210 and 212 may be made of the any suitable low-k (or ultra low-k) dielectric materials. The metal interconnection M4 is defined in the low-k dielectric layer 216 using damascene method known in the art to form designed circuit layout within the active circuit area 12 and to form a damascened metal frame structure 105 within the bonding pad area 10. Damascene via devices (V4) within the active circuit area 12 for connecting M3 with M4 are fabricated in low-k dielectric layer 214. The metal interconnection M5 is defined in the low-k dielectric layer 220 using damascene method known in the art to form designed circuit layout within the active circuit area 12 and to form a damascened intermediate metal layer 103 within the bonding pad area 10. The damascened intermediate metal layer 103 also acts as a bussing metal layer. Damascene via devices (V5) within the active circuit area 12 for connecting M4 with M5 are fabricated in low-k dielectric layer 218. The metal interconnection M6 is defined on the stress-buffering dielectric layer 222 using conventional aluminum wiring method known in the art to form designed circuit layout within the active circuit area 12 and to form a contact pad 101 having a top surface area adequate for landing balls of bonding wires or solder within the bonding pad area 10. Via devices (V6) within the active circuit area 12 for connecting M5 with M6 are fabricated in the stress-buffering dielectric layer 220. It is one of the pivotal features of the present invention that the stress-buffering dielectric layer 222 is made of materials that is less porous (denser) than the underlying low-k or ultra low-k dielectric layers 202~220, for example, silicon dioxide.

The contact pad 101 and via plugs 102a and 102b, which electrically connects the contact pad 101 with the damascened intermediate metal layer 103, are formed at the same sputtering process. An additional barrier layer (not shown) such as tantalum (Ta), titanium nitride (TiN), or the like, is not necessary according to this invention, but is optional for the purpose of improving adhesion quality between the via plug and the damascened intermediate metal layer 103 that is made of copper in this preferred example. It is also an important feature of the present invention that the top metal M6 is made of aluminum that is different from other layers of metal interconnections M1~M5, which are copper damascene system. As shown, the entire active circuit area 12 of the semiconductor chip 1 and a peripheral area of the contact pad 101 within the bonding pad area 10 are covered by a passivation layer 224 such as silicon nitride, polyimide, or the like.

As specifically indicated by the dash line region in FIG. 1, the bonding pad reinforcement structure 100 comprises the contact pad 101 that is made of any suitable bondable metals or alloys. As aforementioned, the contact pad 101 and the circuit within the active circuit area 12 at the same level as the contact pad 101, which are both disposed on the stress-buffering dielectric layer 222, are defined from the metal interconnection M6. Therefore, it is one main feature of the present invention that the bondable contact pad 101 for wire bonding balls and the top layer circuit within the active circuit area 12 are made of the same metal, preferably aluminum or aluminum/copper alloy. In the passivation layer 224, a window 110 is provided to expose corresponding contact pad 101. The passivation layer 224 may be made of silicon nitride or photo-definable polyimide. The later may save a photo mask, since lithography can be carried out directly on it to form the window 110. The aluminum via plugs 102a and 102b also contribute to stress buffering and stress transmission during bonding. In another embodiment, one side of the via plugs 102a and via plugs 102b may be cancelled. A dry etching process is first carried out to etch via openings (not explicitly shown) in the stress-buffering dielectric layer 222. A conventional aluminum sputtering process is then performed to sputter aluminum into these via openings and over the stress-buffering dielectric layer 222. Conventional lithography and metal dry etching are then carried out to form the integrated contact pad 101 and via plugs 102a and 102b. It is noted that since the copper intermediate layer 103 is fabricated by standard copper damascene process, a typical barrier layer 104 lining the wiring trench surface for preventing copper diffusion is also indicated in FIG. 1. The barrier layer 104 may be made of titanium or titanium nitride, but not limited thereto. Power, ground, or input/output signals are transmitted through the contact pad 101, via plugs 102a and 102b, and copper intermediate bussing layer 103.

It is also one pivotal feature of the present invention that the bonding pad reinforcement structure 100 further comprises a metal frame structure 105 directly under the intermediate metal layer 103. The metal frame structure 105 is damascened in the dielectric layer 216. This metal frame structure 105 having four sides (not explicitly shown) and dimensions corresponding to the peripheral contour of the overlying intermediate metal layer 103 exhibits unexpected ability in counteracting the mechanical stress exerted on the contact pad 101 during bonding. Since the metal frame structure 105 is made by standard damascene process, a typical lining barrier layer 106 is indicated. As aforementioned, the damascened metal frame structure 105 of the bonding pad reinforcement structure 100 and the M4 active circuit patterns within the active circuit area 12 are fabricated at the same damascene process. During bonding, a part of the mechanical stress exerted on the contact pad 101 is absorbed by the stress-buffering dielectric layer 222 and the aluminum via plugs 102a and 102b therein. A part of the mechanical stress is effectively counteracted by the damascened metal frame structure 105, thereby protecting the underlying active circuit components 120 from potential damages such as microcracks.

Figure 2:
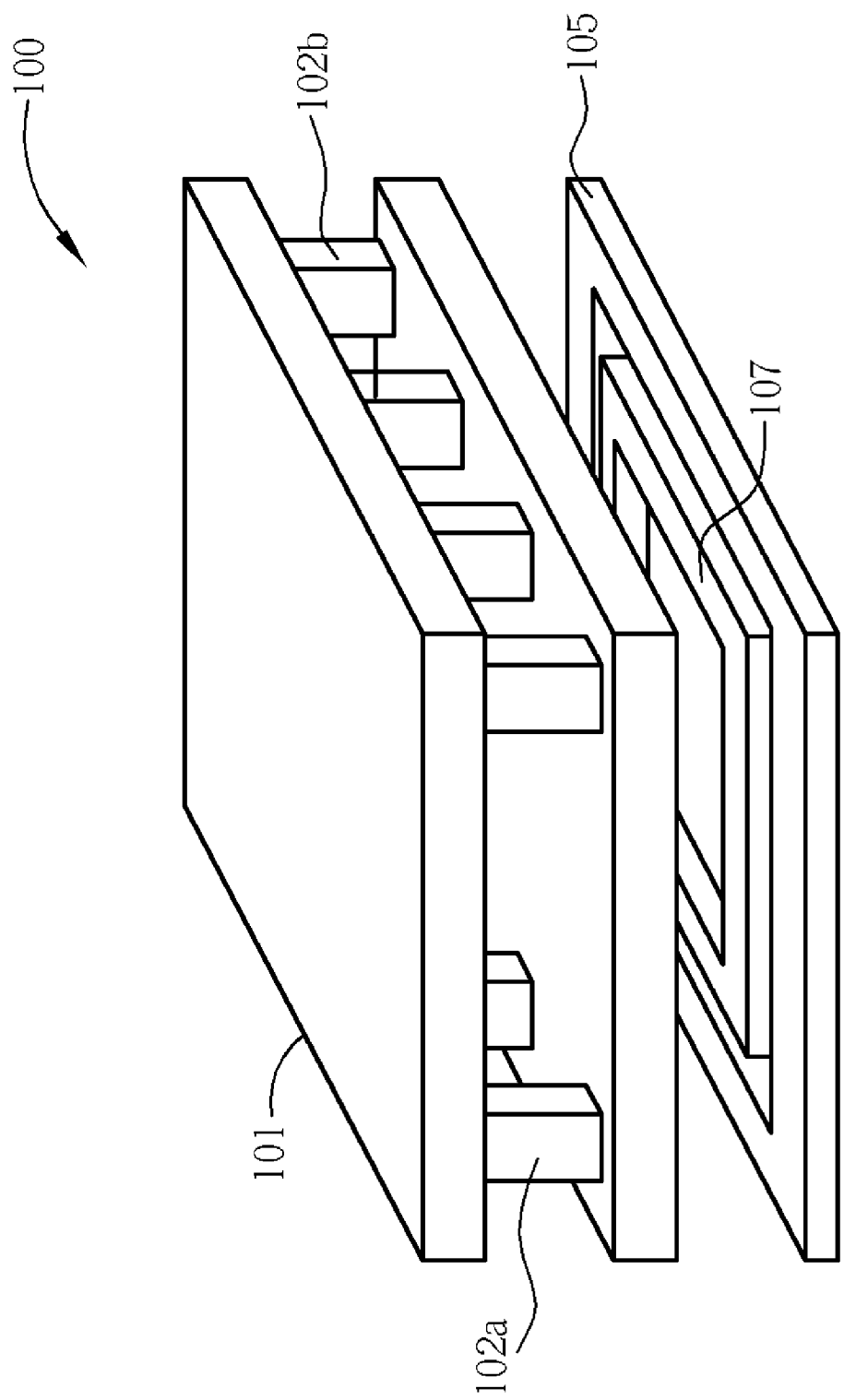
FIG. 2 is a perspective declining side view of a reinforced bonding pad structure in accordance with the second preferred embodiment of the present invention, in which some dielectric layers are ignored for the sake of clarity.

Please refer to FIG. 2. FIG. 2 is a perspective declining side view of a reinforced bonding pad structure 100 in accordance with the second preferred embodiment of the present invention, in which like numerals designate like elements. For the sake of clarity and to emphasize the main skeleton of the reinforced bonding pad structure 100, some dielectric layers including passivation layer 224, stress-buffering dielectric layer 222, low-k dielectric layers 220, 218, 216, and 214 are ignored in FIG. 2. According to the second preferred embodiment, as shown in FIG. 2, the reinforced bonding pad structure 100 comprises a contact pad 101 for landing wire bonding balls, stress-buffering dielectric layer (not shown), a plurality of integral via plugs 102a and 102b, damascened copper intermediate layer 103, and two damascened copper frames 105 and 107 situated directly under the damascened copper intermediate layer 103. The outer damascened copper frame 105 and the inner damascened copper frame 107 are at the same level and have similar shapes. The outer damascened copper frame 105, which encompasses the inner damascened copper frame 107, has four sides (not specifically denoted) and dimensions corresponding to the peripheral contour of the overlying damascened copper intermediate layer 103. The double-frame structure reinforces the strength of the low-k dielectric layer 216 constrained by the double frames 105 and 107 for resisting bonding stress. In another embodiment, the number of damascened metal frames may be three or even higher. In most cases, one or two frames are adequate.

Figure 3:
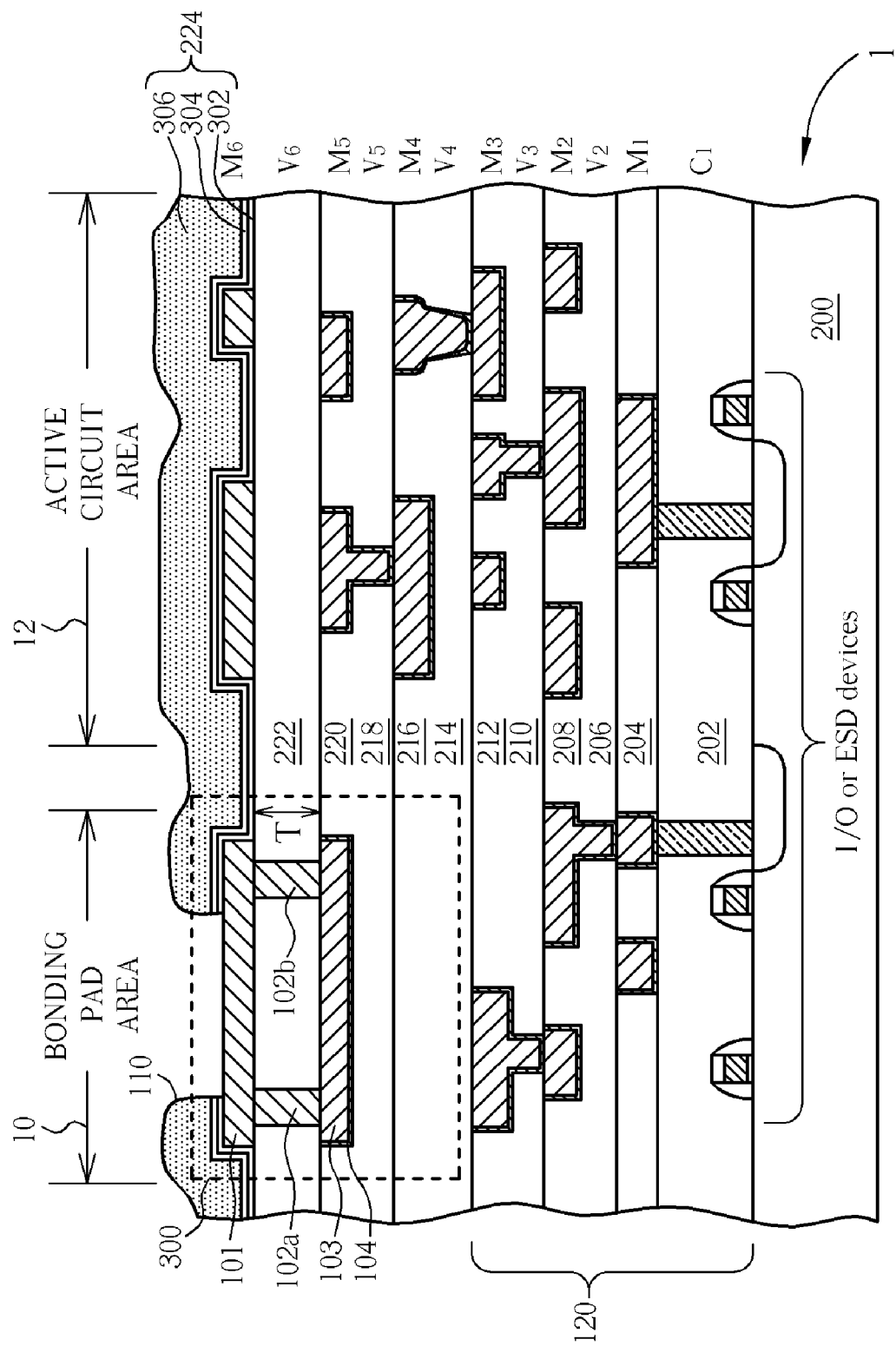
FIG. 3 is a schematic cross-sectional diagram illustrating pivotal portions of an exemplary integrated circuit capable of implementing BOAC in accordance with the third preferred embodiment of the present invention.

FIG. 3 is a schematic cross-sectional diagram illustrating pivotal portions of an exemplary integrated circuit capable of implementing BOAC in accordance with the third preferred embodiment of the present invention, in which like numerals refer to like elements. As shown in FIG. 3, the integrated circuit 1 according to the second embodiment of the present invention comprises a bonding pad area 10 and an active circuit area 12. A bonding pad reinforcement structure 300 is disposed within the bonding pad area 10. Portions of the active circuit components 120 of the integrated circuit 1 are situated directly under the bonding pad reinforcement structure 300. The active circuit components 120 may include input/output (I/O) devices/circuits, or Electrostatic Discharge (ESD) devices/circuits, each of which may further consist of a plurality of semiconductor devices, which are fabricated on a main surface of a substrate 200, for example, such as metal-oxide-semiconductor field-effect transistors (MOSFETs), ion diffusions, etc., and several layers of metal interconnections.

Likewise, the exemplary six layers of metal interconnections are denoted by M1, M2, M3, M4, M5, and M6, respectively. The metal interconnection M6 is the top metal of the integrated circuit 1. In the active circuit area 12, the exemplary six layers of metal interconnections are patterned to form designed active circuit layouts in respective levels, and a plurality of semiconductor devices such as MOSFETs, ion diffusions, capacitors, etc., are provided on the main surface of the substrate 200. According to the preferred embodiment of the present invention, the lower five layers of metal interconnections: M1, M2, M3, M4, and M5 are fabricated by standard copper damascene or dual damascene techniques. The top metal interconnection M6 is fabricated using conventional aluminum (Al) system. The metal interconnection M1 is defined in the low-k dielectric layer 204 above the dielectric layer 202, and is electrically connected to the underlying semiconductor devices on the substrate 200 through contacts C1 fabricated in the dielectric layer 202. The dielectric layer 202 may be silicon dioxide, fluoride silicate glass (FSG), or the like. The active circuit 120 directly under the bonding pad reinforcement structure 300 includes metal interconnections: M1, M2, and M3. In the bonding pad area 10, the metal interconnections M5 and M6 are defined to form parts of the bonding pad reinforcement structure 300.

The metal interconnection M2 is defined in the dielectric layer 208 using damascene method known in the art to form designed circuit layout within both the bonding pad area 10 and the active circuit area 12. Damascene via devices (V2) for connecting M1 with M2 are fabricated in dielectric layer 206. The dielectric layers 206 and 208 may be made of the same low-k (or ultra low-k; k<2.5) dielectric materials. In some cases, the dielectric layers 206 and 208 are made of different dielectric materials. Depending on the damascene methods, a stop layer (not shown) may be interposed between dielectric layers 206 and 208. Likewise, the metal interconnection M3 is defined in the low-k dielectric layer 212 using damascene method known in the art to form designed circuit layout within both the bonding pad area 10 and the active circuit area 12. Damascene via devices (V3) for connecting M2 with M3 are fabricated in dielectric layer 210. The dielectric layers 210 and 212 may be made of the any suitable low-k (or ultra low-k) dielectric materials. The metal interconnection M4 is defined in the low-k dielectric layer 216 using damascene method known in the art to form designed circuit layout within the active circuit area 12. Damascene via devices (V4) within the active circuit area 12 for connecting M3 with M4 are fabricated in low-k dielectric layer 214.

The metal interconnection M5 is defined in the low-k dielectric layer 220 using damascene method known in the art to form designed circuit layout within the active circuit area 12 and to form a damascened intermediate metal layer 103 within the bonding pad area 10. The damascened intermediate metal layer 103 also acts as a bussing metal layer. Damascene via devices (V5) within the active circuit area 12 for connecting M4 with M5 are fabricated in low-k dielectric layer 218. The metal interconnection M6 is defined on the stress-buffering dielectric layer 222 using conventional aluminum wiring method known in the art to form designed circuit layout within the active circuit area 12 and to form a contact pad 101 having a top surface area adequate for landing balls of bonding wires or solder within the bonding pad area 10. Via devices (V6) within the active circuit area 12 for connecting M5 with M6 are fabricated in the stress-buffering dielectric layer 220. It is one of the pivotal features of the present invention that the stress-buffering dielectric layer 222 is made of materials that is less porous (denser) than the underlying low-k or ultra low-k dielectric layers 202~220. According to the third preferred embodiment, the stress-buffering dielectric layer 222 is PECVD oxide having a thickness T that is between 2000 angstroms and 12000 angstroms, preferably between 3000 angstroms and 8000 angstroms. The difference between the first embodiment and this embodiment is that in this embodiment, the stress-buffering dielectric layer 222 is so thick (>2000 angstroms) that the damascened metal frame structure 105 of FIG. 1 can be omitted.

The contact pad 101 and via plugs 102a and 102b, which electrically connects the contact pad 101 with the damascened intermediate metal layer 103, are formed at the same sputtering process. An additional barrier layer (not shown)

such as tantalum (Ta), titanium nitride (TiN), or the like, is not necessary according to this invention, but is optional for the purpose of improving adhesion quality between the via plug and the damascened intermediate metal layer 103 that is made of copper in this preferred example. It is also an important feature of the present invention that the top metal M6 is made of aluminum that is different from other layers of metal interconnections M1~M5, which are copper damascene system. As shown, the entire active circuit area 12 of the semiconductor chip 1 and a peripheral area of the contact pad 101 within the bonding pad area 10 are covered by a passivation layer 224 comprising silicon oxide 302, silicon nitride 304 and polyimide 306.

As specifically indicated by the dash line region in FIG. 3, the bonding pad reinforcement structure 300 comprises the contact pad 101 that is made of any suitable bondable metals or alloys. As aforementioned, the contact pad 101 and the circuit within the active circuit area 12 at the same level as the contact pad 101, which are both disposed on the stress-buffering dielectric layer 222, are defined from the metal interconnection M6. Therefore, it is one main feature of the present invention that the bondable contact pad 101 for wire bonding balls and the top layer circuit within the active circuit area 12 are made of the same metal, preferably aluminum or aluminum/copper alloy.

In the passivation layer 224, a window 110 is provided to expose corresponding contact pad 101. The passivation layer 224 comprises silicon oxide 302, silicon nitride 304 and photo-definable polyimide 306. The later may save a photo mask, since lithography can be carried out directly on it to form the window 110. The aluminum via plugs 102*a* and 102*b* also contribute to stress buffering and stress transmission during bonding. A typical barrier layer 104 lining the wiring trench surface for preventing copper diffusion is also indicated in FIG. 3. The barrier layer 104 may be made of titanium or titanium nitride. Power, ground, or input/output signals are transmitted through the contact pad 101, via plugs 102*a* and 102*b*, and copper intermediate bussing layer 103.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit comprising:
   an aluminum bonding pad defined on a stress-buffering dielectric layer having a thickness that is greater than 2000 angstroms;
   an aluminum active circuit layout, wherein said aluminum active circuit layout and said aluminum bonding pad are simultaneously defined on said stress-buffering dielectric layer;
   a damascened intermediate copper layer fabricated in an inter-metal dielectric (IMD) layer that is under said stress-buffering dielectric layer, and said damascened intermediate copper layer being disposed directly under said aluminum bonding pad and electrically connected to said aluminum bonding pad through a plurality of via plugs integrated with said aluminum bonding pad, wherein said stress-buffering dielectric layer is structurally denser than said IMD layer;
   active circuit components of said integrated circuit disposed directly under said damascened intermediate copper layer; and
   a passivation layer comprising silicon oxide, silicon nitride and polyimide covering said stress-buffering dielectric layer and partially covering said bondable metal pad.

2. The integrated circuit according to claim 1 wherein said stress-buffering dielectric layer is PECVD oxide.

3. The integrated circuit according to claim 1 wherein said aluminum active circuit layout over said stress-buffering dielectric layer is covered by said passivation layer.

* * * * *